United States Patent [19]

Ullrich

[11] 4,272,831
[45] Jun. 9, 1981

[54] TWO-DIMENSIONAL ANALOG MEMORY

[75] Inventor: Manfred F. Ullrich, Denzlingen, Fed. Rep. of Germany

[73] Assignee: ITT Industries, Inc., New York, N.Y.

[21] Appl. No.: 93,959

[22] Filed: Nov. 14, 1979

[30] Foreign Application Priority Data

Nov. 25, 1978 [DE] Fed. Rep. of Germany ....... 2851111

[51] Int. Cl.³ ............................................ G11C 11/40
[52] U.S. Cl. .................................. 365/45; 307/238.5; 365/238

[58] Field of Search ................... 365/45; 307/238, 279

Primary Examiner—Terrell W. Fears
Attorney, Agent, or Firm—John T. O'Halloran; Peter C. Van Der Sluys

[57] ABSTRACT

Two-dimensional analog memory monolithically integrated with insulated-gate field-effect transistors, operating on the charge-transfer, and more particularly on the bucket-brigade principle, for temporarily storing the signals originating with the two half pictures of a (TV) video signal.

2 Claims, 17 Drawing Figures

TWO-DIMENSIONAL ANALOG MEMORY

BACKGROUND OF THE INVENTION

This invention relates in general to a memory device and more particularly to a two-dimensional analog memory monolithically integrated with insulated-gate field-effect transistors operating on the charge-transfer principle. A system with the aid of which a small picture of a selected second program can be made visible within the picture of a selected first program displayed on the screen of a television receiver has become known from the German Offenlegungsschrift (DE-OS) 26 28 737 corresponding to U.S. Pat. No. 4,139,860 as well as from an article published on pages 758 to 762 of the technical journal "Funkschau," 1977. For this purpose there are used in particular some additional highly integrated circuits of which one type serves to temporarily store the picture of the selected second program, and of which another type serves the time control of this display. In the course of this, the brightness signal of the picture of the second program, i.e. of the so-called small picture, in an alternating half picturewise manner is stored in the two partial memories of the analog memory, and read out. The storing is carried out in phase with the received small picture transmitter, whereas the readout is performed at about four times the speed thereof, at that particular time in which the small picture is displayed.

Practice has shown that the variations of the electrical properties of the two partial memories, owing to them being manufactured as separate integrated circuits, lead to visible interference effects in the displayed small picture, because the two half pictures as displayed, each have to pass through electrically different partial memories.

SUMMARY OF THE INVENTION

One way of overcoming the above drawback resides in correspondingly dimensioning the two partial memories with respect to their electrical properties and in "pairing" them so to speak; this, however, may be encountered by difficulties owing to the size of the semiconductor chip of these partial memories.

Another way of overcoming the above drawback, resides in that, during the manufacture of the partial memories, is performed on a semiconductor chip having a diameter ranging from 7.5 to 12.5 cm, is to leave always two juxtaposed partial memories in this spatial assignment, and to arrange them inside a casing common to both. This measure, too, has proved more or less unsuitable because also semiconductor chips arranged next to each other, may still have different electrical data.

It is the object of this invention, to provide a two-dimensional analog memory monolithically integrated with insulated-gate field-effect transistors, no longer having the aforementioned drawbacks. Based on the recognition underlying this invention, this can be accomplished in that the two half pictures of the small picture do not have to be passed through two partial memories alternatingly, but only through the analog memory designed in accordance with the invention. Being able to do without the second series chain of the one partial memory, and without the first series chain of the other partial memory, and in spite of arranging the setting stage on the semiconductor chip of the analog memory, there will result a reduction of the semiconductor chip surface area compared with the total area occupied by the two conventional partial memories. In addition thereto, i.e. from including the setting stage in the semiconductor chip there will result a reduction in the number of outer terminals compared with the total number of terminals of the two partial memories, as well as compared with the number of terminals of one individual partial memory; the number of outer terminals of the analog memory is by one smaller than that of a partial memory.

BRIEF DESCRIPTION OF THE DRAWINGS

This invention will now be explained in greater detail with reference to FIGS. 1 to 5 of the accompanying drawings, in which.

DETAILED DESCRIPTION OF THE PREFERRED EMBODIMENTS

Figure 1:
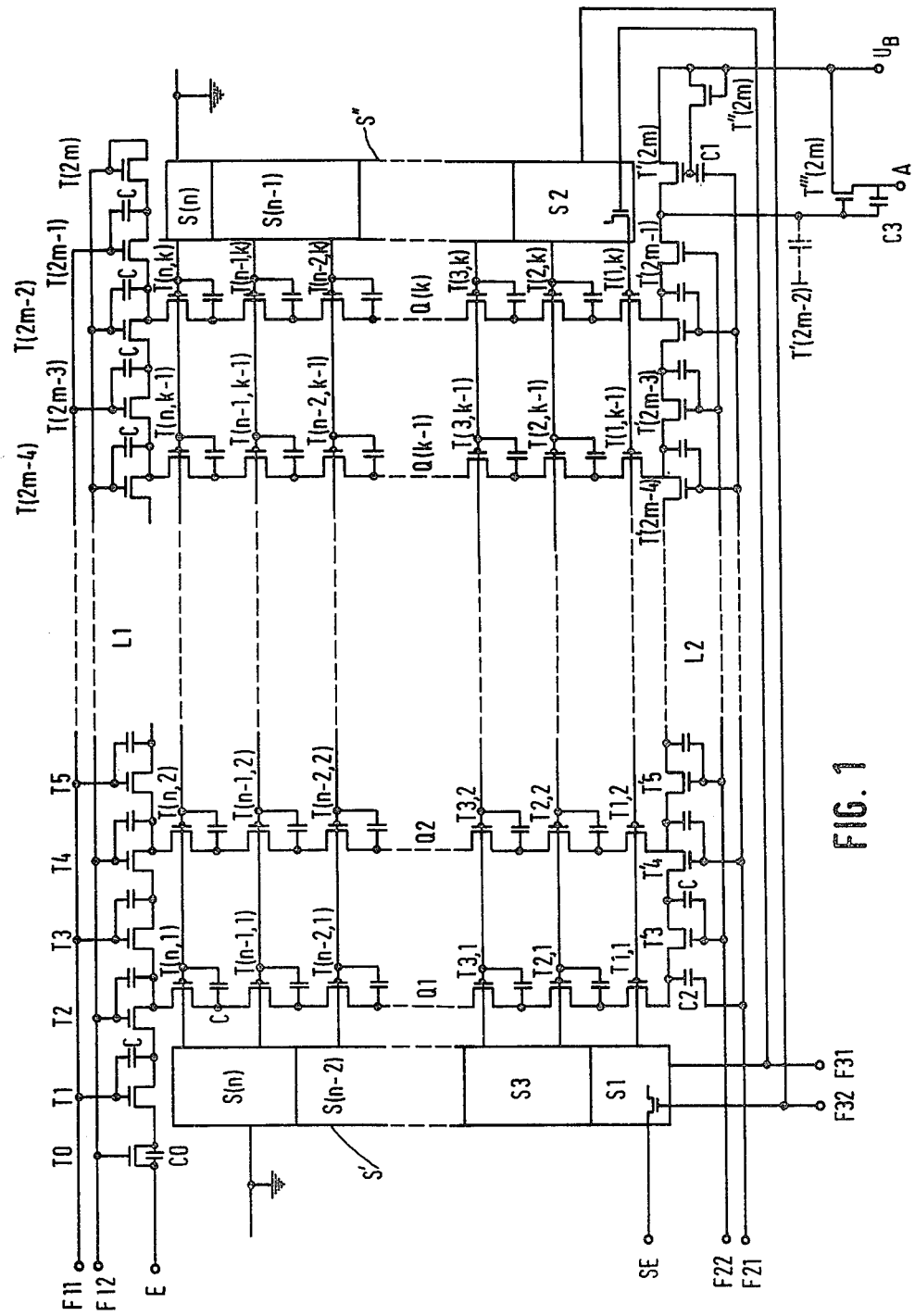
FIG. 1, partly schematically, shows the circuit diagram of a conventional type of partial memory.

FIG. 1 shows the circuit diagram of a conventional type of partial memory. This actually concerns a delay line based on the charge transfer device principle. To the charge transfer devices there belong, on one hand, the so-called bucket-brigade circuits and, on the other hand, the charge-coupled devices. The partial memory according to FIG. 1 is designed in accordance with the bucket brigade principle, comprising a plurality of stages of the same kind each consisting of a transistor T . . . and of a capacitor C arranged between the gate terminal and the collector terminal thereof, and which are series-arranged in such a way that the collector terminal of the one is connected to the emitter terminal on the next successive transistor, with the gate terminals of the even-numbered transistors being controlled by one portion of a rectangular or trapezoidal clock signal, and the gate terminals of the odd-numbered transistors being controlled by a second part of the rectangular or trapezoidal clock signal. The two parts of the clock signal are of equal frequency and in such a way assigned to one another that the effective pulses of the one part will come to lie in the gaps between the effective pulses of the other part.

Bucket-brigade circuits may be designed to consist of discrete components, but may also be realized in the form of integrated circuits. As the transistors, it is possible to employ bipolar as well as field-effect transistors, with insulated-gate field-effect transistors being of advantage especially in the latter case, hence employing for the integration the so-called MOS-technology. The partial memory as shown in FIG. 1 is actually composed of such insulated-gate field-effect transistors, for which purpose there may be used either P-channel or N-channel type transistors, quite depending on what particular integration technology or what voltage polarity appears to be the most suitable for the specific case of practical application. Likewise, it is possible to employ enhancement or depletion types of field-effect transistors.

FIG. 1, inter alia, shows the transistors T0, T1, T2 T3, T4, T5, T(2m−4), T(2m−3), T(2m−2), T(2m−1) and T(2m). These transistors are interconnected with the associated capacitors C in the manner described hereinbefore, and arranged in series. The odd-numbered transistors T1, T3, T(2m−3), T(2m−1) are applied with their gate electrodes to the first clock signal F11 of the first clock signal pair F11, F12, and the even-numbered transistors T0, T2, T4, T(2m−4), T(2m−2), T(2m) are applied with their gate electrodes to the second clock signal F12 of the first clock signal pair F11, F12.

These two clock signals F11, F12, with respect to their waveforms as a function of time, consist of a rectangular and equifrequency voltage referred to the zero point of the circuit, with the amplitude of the one clock signal lying in the gap between the effective pulses of the other clock signal, and vice versa. Each of the clock signals may have a pulse duty factor of 0.5, but it is also possible to choose a pulse duty factor differing therefrom, i.e. in such a way that between the effective pulses of the two clock signals there will appear gaps during which both clock signals are at zero.

The signal to be stored is applied to that particular input E which is in connection with the controlled current path of the input transistor T0. This current path is bridged by the input capacitor C0 which, compared with the connection of the input capacitor to the zero point of the circuit, has the advantages as disclosed in the German Patent Application No. P 28 13 606.3, corresponding to my U.S. patent application Ser. No. 019,397 of Mar. 12, 1979.

The last transistor T(2m) serves to terminate the bucket brigade circuit with respect to direct current. In so doing, the one terminal of the controlled current path of the transistor T(2m) is connected to the gate electrode thereof.

In FIG. 1, the aforementioned components form the first longitudinal chain L1. Moreover, FIG. 1 shows the transversal chains Q1, Q2, Q(k−1), Q(k) as well as the second longitudinal chain L2.

To each of the even-numbered transistors contained in the first longitudinal chain L1, hence to the transistors T2, T4 T(2m−4), T(2m−2), there is connected a transversal chain of stages of the same kind, namely the transversal chains Q1, Q2(k−1), Q(k). Each of the transversal chains contains the same number of n stages and, owing to the series arrangement of the individual stages thereof, each forms a bucket-brigade circuit. The gate electrodes of the transistors of same ordinal number n (n=1,2 . . . ) of the k transversal chains are connected to one another and extend to one output of the stages of the same number n of the shift register S which, for the sake of obtaining a better geometrical arrangement, is subdivided into the two parts S′, S″. The transistors contained in the transversal chains are indicated by double indices the first one of which indicating the number n of the corresponding stage, and the second one of which indicating the number k of the corresponding transversal chain. The direction of increasing n has been chosen to extend from the second to the first longitudinal chain, because also n indicates the number of stages of the shift register S, and because the information set therein, is shifted from the setting input SE in this particular direction. Accordingly, the counting direction for n is in opposition to the direction in which the signal to be stored is shifted through the transversal chains.

Of the transistors of the transversal chain, the following are shown in FIG. 1:

Transversal Chain Q1: T1, 1; T2, 1; T3, 1; T(n−2, 1); T(n−1, 1); T(n,1).

Transversal Chain Q2: T1, 2; T2, 2; T3, 2; T(n−2, 2); T(n−1, 2); T(n, 2).

Transversal Chain Q(k−1): T(1, k−1); T(2, k−1); T(3, k−1); T(n−2, k−1); T(n−1, k−1), T(n, k−1).

Transversal Chain Q(k): T(1, k); T(2, k); T(3, k); T(n−2, k); T(n−1, k), T(n, k).

The outputs of the individual transversal chains are connected to the second longitudinal chain L2, with respect to its structure, is substantially identical to the structure of the first longitudinal chain L1. The second longitudinal chain L2 contains the transistors T′3, T′4, T′5, T′(2m−4), T′(2m−3), T′(2m−2), T′(2m−1), T′(2m).

At the point connecting the controlled current path of the respective odd-numbered transistor with its associated capacitor of the second longitudinal chain L2, there are connected the outputs of the individual transversal chains. Thus, the output of the transversal chain Q1 is connected to the terminal of capacitor C2 belonging to the first even-numbered transistor, in which case, however, the first even-numbered transistor of the second longitudinal chain L2 corresponding to the first even-numbered transistor T2 of the first longitudinal chain L1, is not required. The output of the second transversal chain Q2, hence the transistor T1, 2 is applied to the point connecting the controlled current path of the transistor T′4 to the associated capacitor, and likewise, the corresponding outputs of the transversal chains Q(k−1), Q(k) with the transistors T(1, k−1), T(1, k) are connected to the transistors T′(2m−4), T′(2m−2).

The controlled current path of transistor T′(2m) is connected in series with the controlled current path of transistor T′(2m−1), with the drain electrode thereof being applied to the constant supply voltage $U_B$, and with the gate terminal thereof being connected capacitively via the capacitor C1 to the clock signal F21. Moreover, between the gate terminal of transistor T′(2m) and the constant supply voltage $U_B$, there is still arranged the transistor T″(2m) which is connected as a diode, with this property being achieved in that the gate and the drain terminals thereof are directly connected with one another, and applied to the constant supply voltage $U_B$.

To the point connecting the controlled current paths of both the transistor T′(2m−1) and the transistor T′(2m), there is applied the gate terminal of the output transistor T‴(2m), with this terminal being connected, via the capacitor C3, to the source terminal thereof, hence to the output A. This output circuit corresponds to that in German Patent Application No. P 28 24 466.8, corresponding to my U.S. patent application Ser. No. 040,828 of May 21, 1979 and has the advantages disclosed therein over the conventional type of output circuit employing a source follower.

The second longitudinal chain L2 is controlled by the second pair of clock signals F21, F22 which, with respect to its shape of curve, may be identical to that of the pair of clock signals F11, F12, but of higher frequency compared therewith.

Figure 2:
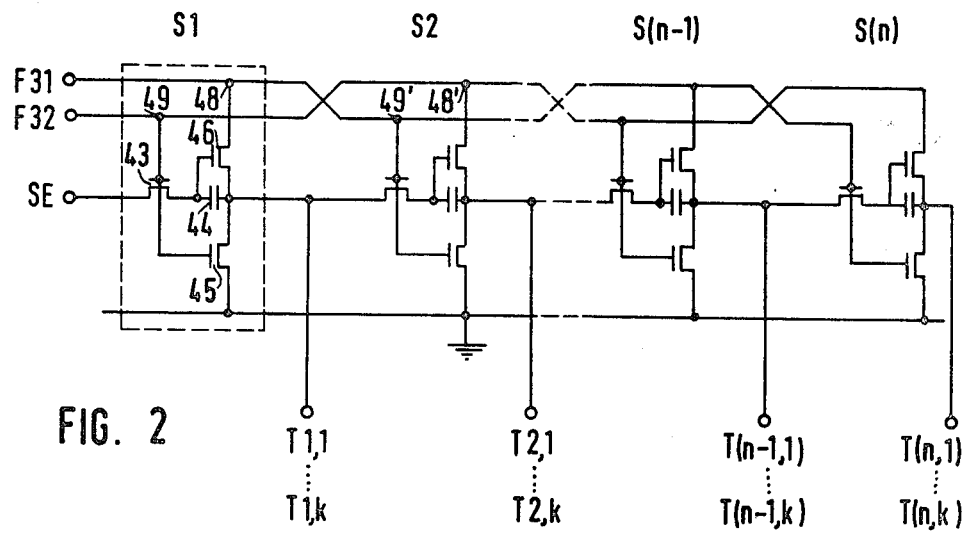
FIG. 2 shows the circuit diagram of a conventional type of shift register used for controlling the partial memory according to FIG. 1.

The shift register stages S1, S2, S3, S(n−2), S(n−1), S(n) as already mentioned hereinbefore, are only schematically denoted in FIG. 1. The structure of these stages is shown more particularly in FIG. 2. Details of this structure are known from the aforementioned German Offenlegungsschrift (DE-OS) No. 26 28 737 and U.S. Pat. No. 4,139,860. There is concerned a dynamic shift register for the operation of which there are required two non-overlapping clock signals. One of the stages shown in FIG. 2, is framed by a broken line. This stage contains the first switching transistor 45 which is connected, on one hand, with the one end of its controlled current path to the zero point of the circuit and, on the other hand, with its other end to the controlled current path of the second switching transistor 46, with the free end of its controlled current path being applied to the first clock signal input 48 or 48' respectively.

The controlled current path of the coupling transistor 43 extends from the setting input SE to the gate terminal of the second switching transistor 46 which, via the capacitor 44, is applied to the point connecting the two switching transistors 45, 46 and simultaneously forming the output of the respective stage. The gate terminals of both the first switching transistor 45 and the coupling transistor 43 are applied to the second clock signal input 49 or 49' respectively.

Successively following stages are controlled in such a way by the third pair of clock signals F31, F32 that to both the first clock signal input 48 and the second clock signal input 49' of two adjacent stages there is applied the clock signal F31 while the clock signal F32 is applied to both the second clock signal input 49 and the first clock signal 48' of the same adjacent stages. Hence, in other words, the third pair of clock signals F31, F32 is respectively applied to successively following stages in a diagonally transposed manner.

The mode of operation of the arrangement according to FIG. 2 is as follows:

Assuming the binary state H as defined by high potential, is applied to the input SE. Via the coupling transistor 43 which is driven into saturation by the clock signal F32, this state is transferred to both the gate terminal of the second switching transistor 46 and the capacitor 44, causing the latter to be charged. During the next half cycle of the clock signal in which the clock signal F31 is applied to the clock signal input 48, the second switching transistor 46 is thus driven into saturation by the charged capacitor 44, and the H-potential is applied in a non-inverted manner to the output of stage S1. The output signal, hence the input signal for the transistors T1, 1 to T (1, k) is thus caused to assume the defined value of the amplitude of the clock signal F31.

At the next half cycle the potential at this output compulsorily changes into the L-state as defined by a lower potential, because the clock signal F31 as applied to the series arrangement of the two switching transistors 45, 46, likewise assumes its L-state, thus causing the first switching transistor 45 to become conductive while the second switching transistor 46 is blocked. Accordingly, in each stage a shifted H- or L-state is followed by an L-state.

Figure 3:
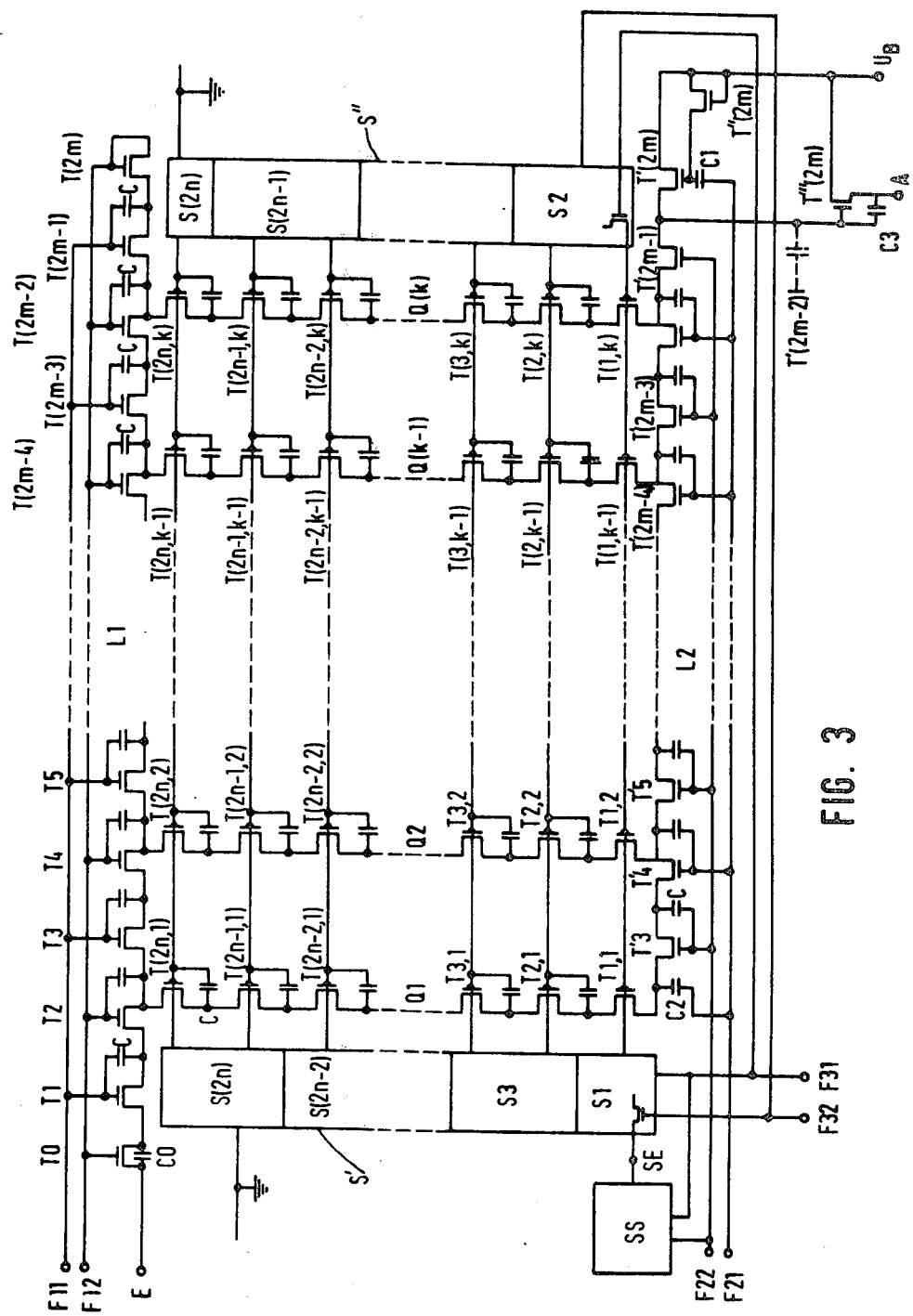
FIG. 3, partly schematically, shows the circuit diagram of one example of embodiment of the analog memory according to this invention.

FIG. 3 shows an example of embodiment of the analog memory according to the invention. Formally, the circuit diagram almost resembles that of FIG. 1, but it should be noted that the transversal chains and the shift register now have double the number of stages 2n; wherever in FIG. 1 the number n is shown as an index, there will now appear in FIG. 3 the number 2n as an index. In distinction to FIG. 1, the example of embodiment as shown in FIG. 3 contains the shift register stages S(2n−2), S(2n−1), S(2n) as well as the transistors T(2n−2,1); T(2n−2, 2); T(2n−2, k−1), T(2n−2, k); T(2n−1, 1); T(2n−1, 2); T(2n−1, k−1); T(2n−1, k); T(2n, 1); T(2n, 2); T(2n, k−1); T(2n, k).

Figure 4:
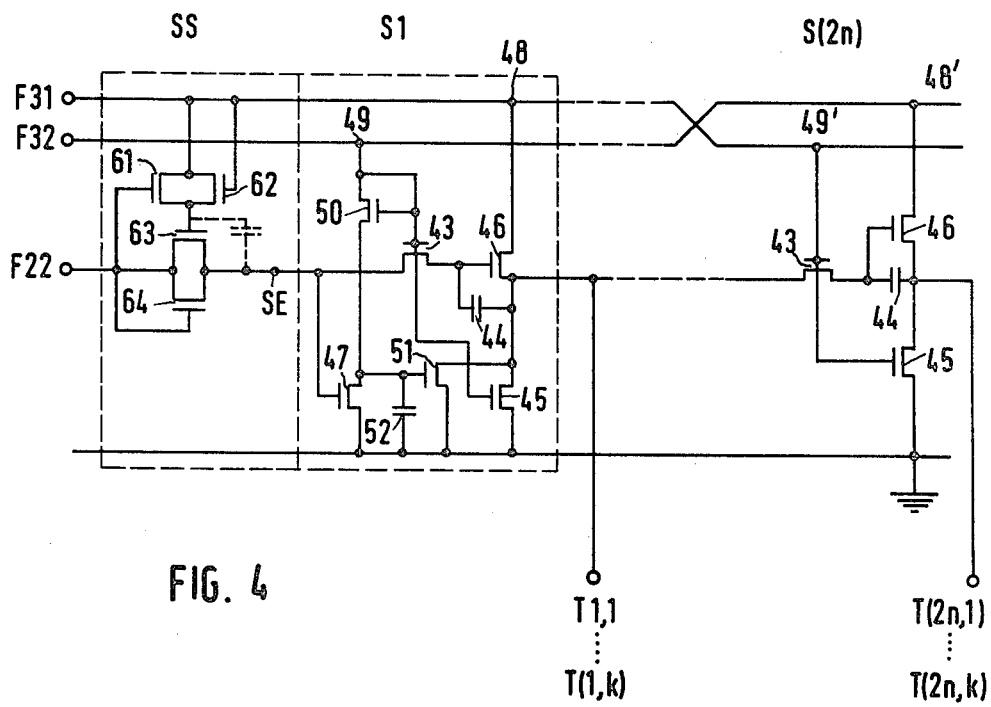
FIG. 4 shows the circuit diagram of an example of embodiment of both the shift register and the setting stage as employed according to this invention.

Moreover, there is integrated as well the setting stage SS which is arranged to precede the setting input SE of the shift register and which is aimed at producing the setting pulse from the one clock signal F22 of the second pair of clock signals F21, F22. As is shown in FIG. 4, it contains the four transistors 61, 62, 63, 64 of which the controlled current paths of the first and the second or of the third and the fourth are connected in parallel with one another. The one side of the parallel arrangement of both the first and the second transistor 61, 62 is applied together with the gate terminal of the second transistor 62 to that particular clock phase F31 of the third pair of clock signals F31, F32 to which there is also connected the second switching transistor 46 of the first shift register stage S1. The other side of the parallel arrangement of both the first and the second transistor 61, 62 is applied to the gate terminal of the third transistor 63. The one side of the parallel arrangement of both the third and the fourth transistor 63, 64 is applied together with the gate terminal of the first, and the gate terminal of the fourth transistor 64 to that particular clock phase F22 of the second pair of clock signals F21, F22, to which there is also connected the first stage (transistor T'3) of the second series chain L2. The other side of the parallel arrangement of both the third and the fourth transistor 63, 64 is applied to the setting input SE of the shift register S.

Furthermore, FIG. 4 shows the first shift register stage S1, as provided according to the invention, with its enlarged structure as compared to that of the corresponding stage according to FIG. 1.

For that purpose, this stage contains the inverter consisting of the additional switching transistor 47 and of the associated load transistor 50, with these transistors, arranged in series with their controlled current paths, being arranged between the zero point of the circuit and the second clock signal input 49 or 49' respectively, to which there is also applied the gate terminal of the load transistor 50. The gate terminal of the additional switching transistor 47 is applied to the setting input SE and, consequently, also to one end of the controlled current path of the coupling transistor 43.

The output of the inverter as composed of the transistors 47, 50, hence the point connecting the two controlled current paths thereof, is applied, on one hand, across the additional capacitor 52, to the zero point of the circuit and, on the other hand, to the gate terminal of the by-pass transistor 51 whose controlled current path is applied on one hand to the zero point of the circuit and, on the other hand, to the output feeding the transistors T1 1 to T(1, k). Accordingly, it will be seen that the controlled current path of the by-pass transistor 51 is also in parallel with that of the first switching transistor 45. The inverter as formed by the transistors 47, 50 is of the type capable of being realized in accordance with the well known ratio technique for dimensioning insulated-gate field effect transistor inverter stages.

If a non-enlarged stage were to be selected as the first stage S1, the function thereof would not be safeguarded because for this, these stages require a sufficiently high capacitive load at the respective output. This capacitance which is given by the inputs of the respective transistors of the transversal chains, however, is smaller at the output of the first stage S1 than with the other stages, because with the transistors T1, 1 to T1, k there is missing the capacitor bridging the gate-source line.

With the analog memory according to this invention all time sequences appearing during operation as a memory for the two half pictures of a television signal, can be mastered reliably. The storing in and the reading out of the memory can always be carried out in such a way that the shifting of the picture signals through the transversal chains in the upper memory half is only effected when a vertical shifting is also performed in the lower memory half, i.e. there will not appear a shifting alone in the upper memory half without a shifting taking place in the lower memory half. In this way it is possible to provide the 2n-stage shift register S with only one signal setting input SE at the input of the first shift register stage S1.

By taking a corresponding influence upon the third pair of clock signals F31, F32, it is possible, at any suitable point within the 2n-stage shift register S, to erase the set information running therein, hence for instance, an H-level. This is done in that, at the intended time position of erase, both clock signals of the third pair of clock signals F31, F32 assume the H-level. This causes the transistors 43, 45 in all stages of the shift register S to be rendered conductive, thus drawing the output of each shift register stage to zero potential. The charged capacitor 44 is discharged by this, and the transistor 46 is rendered non-conductive. Accordingly, if a vertical displacement is only to be carried out in the lower memory half, the setting information, upon reaching the topmost line of the lower memory half, is to be erased in the way as stated hereinbefore.

Also the setting information as produced in the setting stage SS, whenever the clock signal F22 of the second pair of clock signals F21, F22 is permanently at an L-level, hence is stopped so to speak, is again suppressed at the output of the first shift register stage S1 to which the transistors T1, 1 to T1, k are connected, when both clock signals of the third pair of clock signals F31, F32 simultaneously assume the H-level. In this way it is possible, by correspondingly controlling the clock signals F22, F31, F32, to produce the setting information, as well as to erase this information again at any desired time positions.

Figure 5:
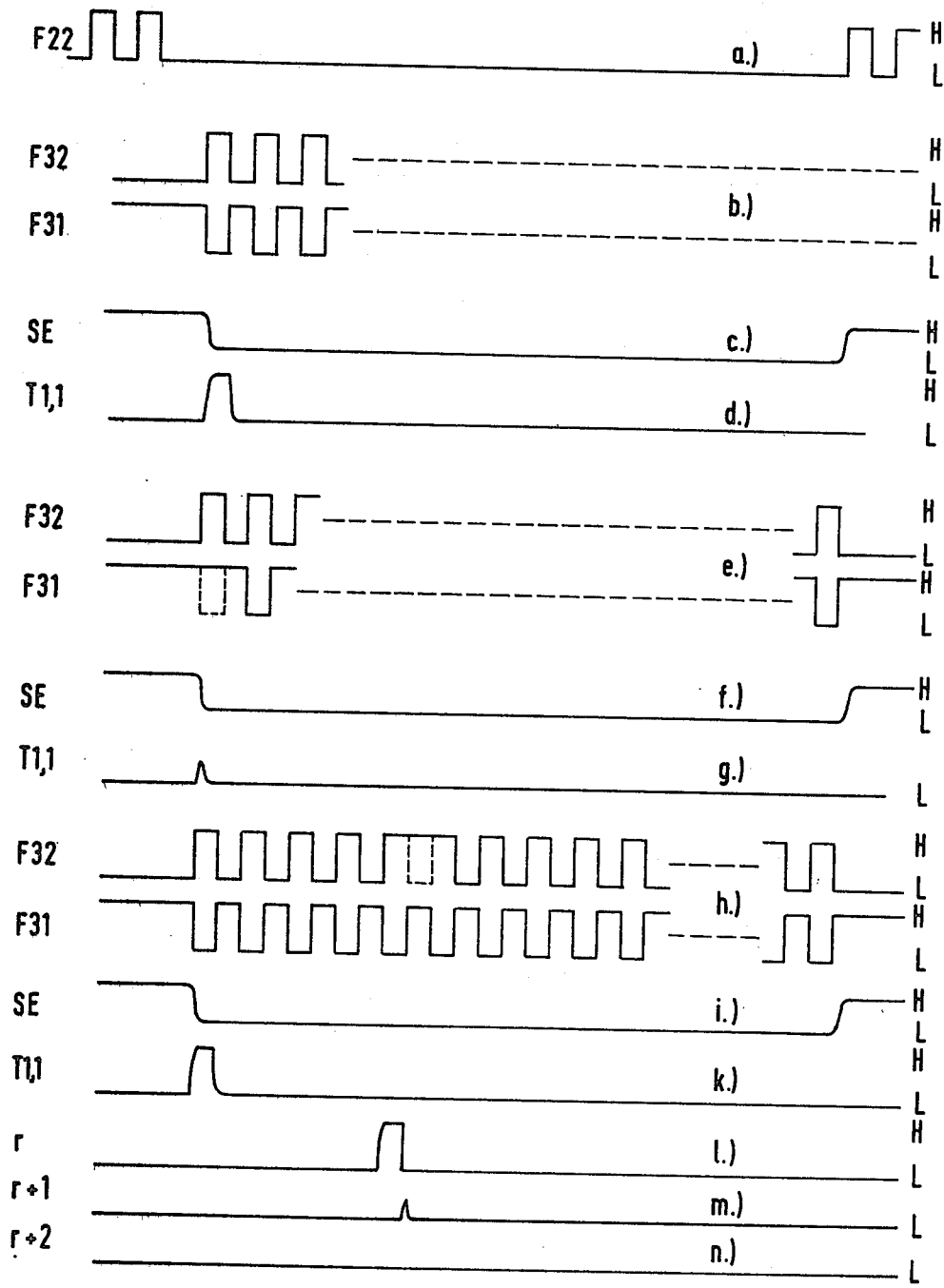
FIG. 5, including a–n, shows various signal waveforms relating to FIG. 4.

FIG. 5 serves to explain the processes which have just been described hereinbefore. In this, FIGS. 5a to 5d show the generation of a setting information at the output of the first shift register stage S1, while FIGS. 5a and 5e to 5g show the aforementioned "blocking" of the setting information as produced in the setting stage SS by taking influence upon the clock signal F31 in such a way that it, simultaneously with the clock signal F32, assumes an H-level, and finally, FIGS. 5a and 5h to 5n show the erase of a setting information in any arbitrary stage r+1 within the shift register.

FIG. 5a shows the waveform of the clock signal F22 during which a setting information can be produced in the setting stage SS. As already mentioned hereinbefore, the clock signal F22 is so to speak stopped for these periods of time. FIG. 5b shows the waveform of the pair of clock signals F31, F32 which, together with the clock signal F22 according to FIG. 5a, produces the pulse as shown in FIG. 5d, at the output of the first shift register stage S1. FIG. 5c shows the information at the setting input SE, that is, from the first H-level of the clock signal F32, and when "stopping" the clock signal F22, an L-level is permanently applied to the setting input SE.

The dashlined first pulse of the clock signal F31 as shown in FIG. 5g is supposed to indicate that at this particular time position the H-level appears simultaneously with the clock signal F32. Accordingly, as shown in FIG. 5g, merely a pulse remainder appears at the output of the first shift register stage S1 which, by the successively following stages of the shift register, is not evaluated as a setting pulse and, consequently, is not shifted.

In FIG. 5h one of the center pulses of the clock signal F32 is indicated by a dashline, so that simultaneously two H-levels appears. Accordingly, during the directly preceding clock signal half cycle, the setting information is still completely present in the stage r as is shown in FIG. 5l. This setting information, however, is erased in the state r+1, so that only the shown pulse remainder is available which is no longer evaluated as a setting information in the subsequently following stage r+2, see also FIGS. 5m and 5n.

Whereas this invention has been described with respect to specific embodiments thereof, it will be understood that various changes and modifications will be suggested to one skilled in the art, and it is intended to emcompass such searches and modifications as are within the scope of the appended claims.

What is claimed is:

1. Two-dimensional analog memory monolithically integrated with insulated-gate field-effect transistors, operating on the charge-transfer, and more particularly on the bucket-brigade principle, for temporarily storing the signals originating with the two half pictures of a (TV) video signal, wherein:
   two partial memories are in such a way multiplexed-operated that, while the one-half picture is being read into the one partial memory, the other half picture as previously read into the other partial memory, is read out of this partial memory,
   each partial memory comprises a first series longitudinal chain of series-connected stages of the same design operated by a first pair of clock signals, and transversal chains connected to each of the even-numbered or to each of the odd-numbered stages of the first longitudinal chain, with an equal number n of series-connected stages which are interconnected with respect to the control electrodes of their transistors, as well as a second longitudinal chain of series-connected stages of the same design and operated by a second pair of clock signals, with the even-numbered or odd-numbered stages thereof being connected to the end of each time one transversal chain,
   an n-stage shift register of transistors of the same conductivity and control type is moreover associated with each partial memory, in which one stage contains a coupling transistor applied with the one end of the control current path to the information input, a first switching transistor applied with the one end of its controlled current path to the zero point of the circuit, and a second switching transistor, as well as a capacitor (=simple shift register stage), all of which being interconnected in such a way that the series-arranged controlled current paths of both the first and the second switching transistor are applied between the zero point of the circuit and the first clock signal input, that the capacitor is applied between the gate terminal of the second switching transistor and the gate terminals of both the first switching transistor and the coupling transistor being applied in common to the second clock signal input, and in which, alternating in the stages, the first and the second or respectively the second and the first clock signal input are supplied by respectively one of the two parts of a third clock signal pair, and the n parallel-outputs of the shift register are connected to the corresponding first, second n-th stages of the transversal chains as interconnected with one another, with each time one stage being set in the shift register, with this information being shifted in direction from the second to the first longitudinal chain, controlled by the third pair of clock signals, characterized in that:

the two partial memories together with the two associated shift reigsters are in such a way combined on one single semiconductor chip that the analog memory comprises one single first longitudinal chain (L1), 2n-stage transversal chains (Q1, Q2, Q(k−1), Q(k)), one single second longitudinal chain (L2) and one single 2n-stage shift register (S), merely the first shift register stage(S1) is a shift register stage enlarged by an additional switching transistor (47), a load transistor (50), a by-pass transistor (51) and an additional capacitor (52), with these four additional circuit elements being interconnected in such a way that the series-arranged controlled current paths of both the additional switching transistor and the load transistor (47, 50) will come to lie between the zero point of the circuit and the second clock signal input (49, 49'), that the controlled current path of the by-pass transistor (51) will come to lie in parallel with that of the first switching transistor (45), that the additional capacitor (52) will come to lie between the gate terminal of the by-pass transistor (51) and the zero point of the circuit, that the gate terminal of the additional switching transistor (47) will come to lie at the setting input (SE), that the gate terminal of the load transistor (50) will come to lie at the second clock signal input (49, 49') and that the gate terminal of the by-pass transistor (51) will come to lie at the point connecting both the additional switching transistor and the load transistor (47, 50), and that:

the signal for setting the respective one shift register stage is produced with the aid of a setting stage (SS) integrated as well.

2. The analog memory as claimed in claim 1, characterized in that:

the setting stage (SS) contains four transistors (61, 62, 63, 64) of which the controlled current paths of both the first and the second (61, 62) or of the third and the fourth transistors (63, 64) are connected in parallel with one another, the one side of the parallel arrangement of both the first and the second transistor (61, 62) is applied together with the gate terminal of the second transistor (62) to that particular clock phase (F31) of the third clock signal pair (F31, F32), to which the second switching transistor (46) of the first shift register stage (S1) is connected, the other side of the parallel arrangement of the first and the second transistor (61, 62) is applied to the gate terminal of the third transistor (63), the one side of the parallel arrangement of the third and fourth transistor (63, 64) is applied together with the gate terminal of the first (61) and the gate terminal of the fourth transistor (64) to that particular clock phase (F22) of the second clock signal pair (F21, F22), to which the first stage (transistor T'3) of the second longitudinal chain (22) is connected, and the other side of the parallel arrangement of the third and the fourth transistor (63, 64) is applied to the setting input (SE) of the shift register (S).

* * * * *